United States Patent
Haight et al.

(10) Patent No.: US 8,791,355 B2
(45) Date of Patent: Jul. 29, 2014

(54) HOMOGENIZING LIGHT-PIPE FOR SOLAR CONCENTRATORS

(75) Inventors: Richard A. Haight, Mahopac, NY (US); Yves C. Martin, Ossining, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 13/090,304

(22) Filed: Apr. 20, 2011

(65) Prior Publication Data

US 2012/0266935 A1    Oct. 25, 2012

(51) Int. Cl.
*H01L 31/042* (2014.01)

(52) U.S. Cl.
USPC ............................................. 136/246

(58) Field of Classification Search
CPC ............................ H01L 31/0524; Y02E 10/52
USPC ................................. 136/243–265
See application file for complete search history.

(56) References Cited

U.S. PATENT DOCUMENTS

| | | | |
|---|---|---|---|
| 4,830,678 A | 5/1989 | Todorof et al. | |
| 5,255,666 A | 10/1993 | Curchod | |
| 5,286,305 A * | 2/1994 | Laing et al. | 136/246 |
| 6,266,476 B1 | 7/2001 | Shie et al. | |
| 6,653,551 B2 | 11/2003 | Chen | |
| 7,092,415 B2 | 8/2006 | Tanaka | |
| 7,299,632 B2 | 11/2007 | Laing et al. | |
| 7,479,420 B2 | 1/2009 | Tanaka | |
| 7,532,406 B2 | 5/2009 | Hill et al. | |
| 7,684,119 B2 | 3/2010 | Lissotschenko et al. | |
| 7,738,176 B2 | 6/2010 | Somani et al. | |

(Continued)

FOREIGN PATENT DOCUMENTS

| | | |
|---|---|---|
| JP | H 10 293 202 A | 11/1998 |
| WO | 2008/034418 A2 | 3/2008 |
| WO | 2009/061502 A1 | 5/2009 |
| WO | 2009/102671 A2 | 8/2009 |

OTHER PUBLICATIONS http://www.ies-def.upm.es/ies/CRATING/Chapeter3.pdf, "3 The History of Modern Concentrators" The History of Concentrators, Chapter 3, pp. 13-27.

(Continued)

*Primary Examiner* — Jeffrey T Barton
*Assistant Examiner* — Niki Bakhtiari
(74) *Attorney, Agent, or Firm* — Scully, Scott, Murphy & Presser, P.C.; Vazken Alexanian (57) ABSTRACT

A light pipe that can be employed for a Concentrator Photo-Voltaic (CPV) system is provided. The light pipe homogenizes light by diffusion and/or refraction, and can be embodied in a structure that has a low aspect ratio. The diffusion and/or refraction can be effected by concave or convex surfaces of a transparent medium that forms a body of the light pipe, by light diffracting particles, and/or by a diffracting surface. Optionally, multiple transparent media can be employed with a refracting and/or diffracting interface therebetween. The reduced aspect ratio of the light pipe can improve reliability of mechanical alignment in the CPV system as well as reducing the cost of manufacturing and/or aligning the light pipe within the CPV system.

18 Claims, 7 Drawing Sheets

(56) References Cited

U.S. PATENT DOCUMENTS

| | | |
|---|---|---|
| 2004/0112424 A1* | 6/2004 | Araki et al. .................. 136/256 |
| 2006/0185713 A1 | 8/2006 | Mook, Jr. |
| 2008/0041441 A1 | 2/2008 | Schwartzman |
| 2008/0048102 A1 | 2/2008 | Kurtz et al. |
| 2008/0087323 A1* | 4/2008 | Araki et al. .................. 136/256 |
| 2008/0245401 A1 | 10/2008 | Winston et al. |
| 2009/0002834 A1* | 1/2009 | Lissotschenko et al. ..... 359/619 |
| 2009/0071467 A1 | 3/2009 | Benitez et al. |
| 2009/0231739 A1 | 9/2009 | Winston |
| 2010/0012171 A1 | 1/2010 | Ammar |
| 2010/0043778 A1 | 2/2010 | Penciu |
| 2010/0319773 A1 | 12/2010 | West et al. |

OTHER PUBLICATIONS

Leutz, R. et al., "Flux Uniformity and Spectral Reproduction in Solar Concentrators Using Secondary Optics" Tokyo University of Agriculture and Technology, Japan, UNESCO Natural Science Sector, France, pp. 1-12.

GB Search Report dated Apr. 17, 2012 issued in corresponding GB Application No. GB1204933.4.

Office Action, dated Feb. 15, 2013, received from the German Patent Office, issued in corresponding German Patent Application No. 10 2012 206 115.0, together with a Letter from IBM Germany which indicates that the date of the issued Office Action is Feb. 15, 2013.

* cited by examiner

HOMOGENIZING LIGHT-PIPE FOR SOLAR CONCENTRATORS

BACKGROUND

The present disclosure relates to optical devices, and more particularly to optical means for light concentration such as solar concentrators and methods of operating the same.

Concentrator Photo-Voltaic (CPV) systems employ an optical device to focus light on a small photovoltaic receiver, which is a high efficiency photovoltaic cell. In the most efficient systems, for example, the receiver can be a multiple junction photovoltaic cell. The optical system of each CPV cell separates the color spectrum of the sun into multiple color (or wavelength) regions of the spectrum. Each region of the spectrum is absorbed in a selected junction that most efficiently converts the optical power in that spectrum region into electrical power. Typically, each of the different junctions in the multiple junction photovoltaic cell is optimized to provide high conversion efficiency at the wavelength component that is focused onto that junction.

BRIEF SUMMARY

A light pipe that can be employed for a Concentrator Photo-Voltaic (CPV) system is provided. The light pipe homogenizes light by diffusion and/or refraction, and can be embodied in a structure that has a lower aspect ratio than prior art light pipes that rely on reflection therein for light homogenization. The diffusion and/or refraction can be effected by concave or convex surfaces of a transparent medium that forms a body of the light pipe, by light diffracting particles, and/or by a diffracting surface. Optionally, multiple transparent media can be employed with a refracting and/or diffracting interface therebetween. The reduced aspect ratio of the light pipe can improve reliability of mechanical alignment in the CPV system as well as reduce the cost of manufacturing and/or aligning the light pipe within the CPV system.

According to an aspect of the present disclosure, a structure including at least a light pipe is provided. The light pipe includes an optically transparent material and having an entrance surface at a top and an exit surface at a bottom that are respectively configured to provide for entry and exit of light rays at least a pair of sidewalls having a monotonically decreasing width therebetween with distance from the entrance surface to the exit surface and configured to provide internal reflection of the light rays within the light pipe, wherein a non-planar surface is provided upon the light pipe, and the non-planar surface is geometrically shaped to diffract or refract light impinging thereupon, wherein intensity of light is homogenized at a bottom surface of the light pipe by diffraction or refraction of light at the non-planar surface.

According to another aspect of the present disclosure, a method of generating electrical power from a source of radiation is provided. The method includes: providing a structure including a focusing element, a light pipe, and a photovoltaic cell; and directing light, by employing the focusing element, from a light source to the light pipe. The light pipe includes an optically transparent material and has at least a pair of sidewalls having a monotonically decreasing width therebetween with distance from the entrance surface to the exit surface. A non-planar surface is provided upon the light pipe, and the non-planar surface is geometrically shaped to diffract or refract light impinging thereupon. Intensity of light is homogenized at a bottom surface of the light pipe by diffraction or refraction of light at the non-planar surface, and the photovoltaic cell generates electrical power upon irradiation by light having the homogenized intensity.

In one embodiment, the entrance surface of the light pipe having sidewalls having a monotonically decreasing width therebetween with distance from the entrance surface to the exit surface includes at least one concave surface that spreads incoming light within the light pipe. The refracted light is subsequently reflected off the sidewalls having a monotonically decreasing width therebetween with distance from the entrance surface to the exit surface to the exit surface of the light pipe. The light pipe can be formed by molding.

In another embodiment, the entrance surface of the light pipe is provided with small diffracting transparent balls, which generate diffusion and randomization of the overall light paths.

In yet another embodiment, the entrance surface of the light pipe includes a holographic surface or a grating that provides refraction or diffusion of light.

In still another embodiment, diffracting transparent balls are embedded randomly throughout a transparent host material.

DETAILED DESCRIPTION

As stated above, the present disclosure relates to optical means for light concentration such as solar concentrators and methods of operating the same, which are now described in further detail with accompanying figures. Throughout the drawings, the same reference numerals or letters are used to designate like or equivalent elements. The drawings are not necessarily drawn to scale.

As used herein, a function is "monotonically decreasing" with a variable if, for any give pair of a lesser value and a greater value for the variable, the value of the function for the greater value of the variable is not greater than the value of the function for the lesser value of the variable.

As used herein, a function is "strictly decreasing" with a variable if, for any give pair of a lesser value and a greater value for the variable, the value of the function for the greater value of the variable is lesser than the value of the function for the lesser value of the variable.

Figure 1A:
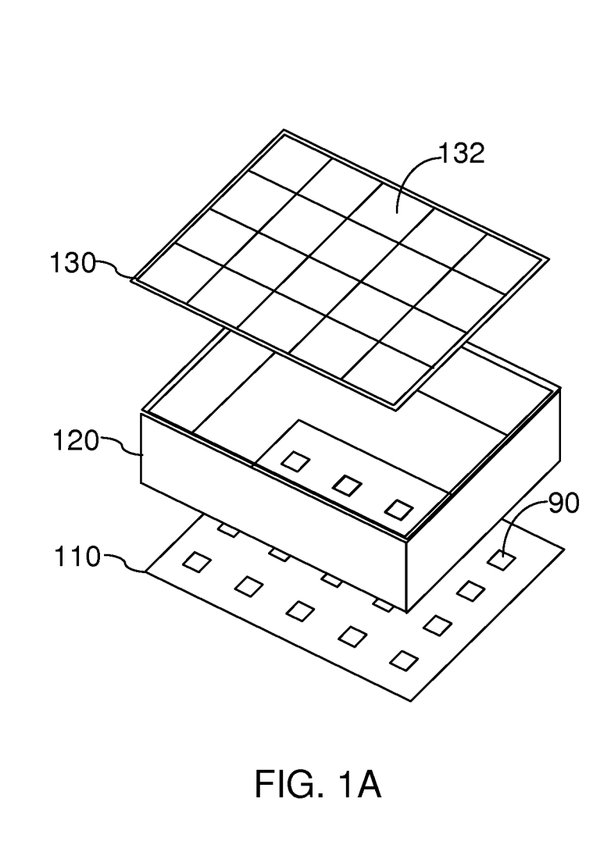
FIG. 1A is a component view of an exemplary Concentrator Photo-Voltaic (CPV) system according to an embodiment of the present disclosure.
Figure 1B:
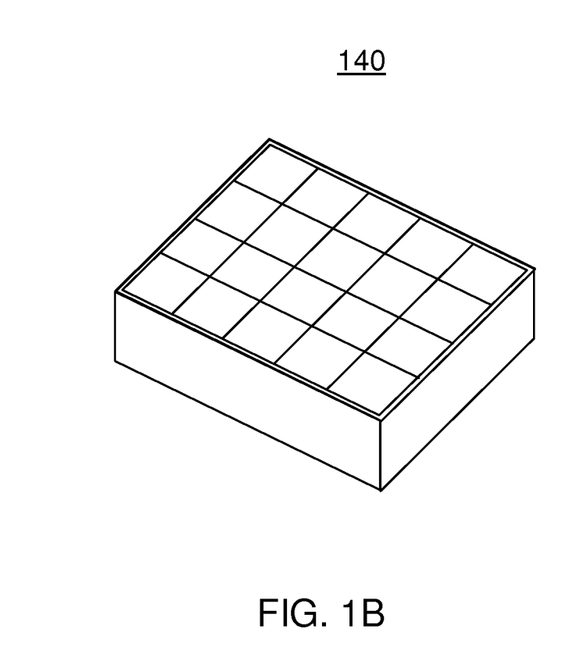
FIG. 1B is an assembly view of the exemplary CPV system according to an embodiment of the present disclosure.
Figure 2:
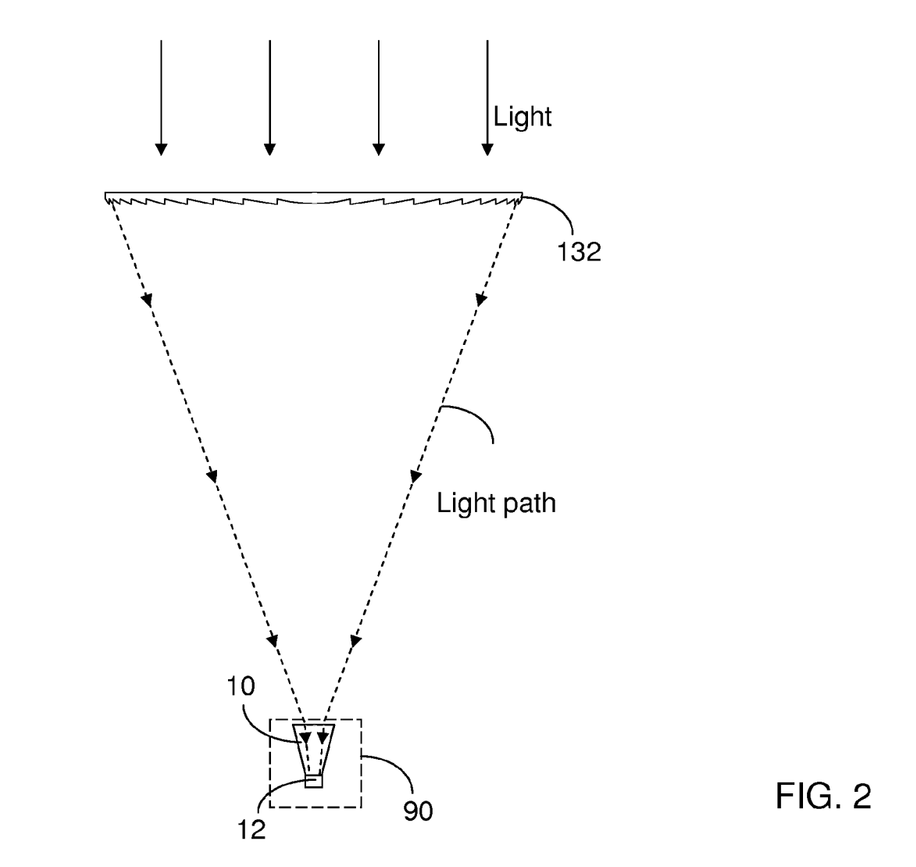
FIG. 2 is a schematic illustration of the geometry of various elements of the exemplary CPV system of FIGS. 1A and 1B.

Referring to FIGS. 1A and 1B, an exemplary Concentrator Photo-Voltaic (CPV) system according to the present disclosure is schematically illustrated. FIG. 1A illustrates the exemplary CPV system in a component view, in which components of the exemplary CPV system are shown separately. FIG. 1B illustrates the exemplary CPV system in an assembly view, in which the exemplary CPV system is shown as assembled. The geometry of the various elements of the exemplary CPV system as assembled is schematically illustrated in FIG. 2.

The exemplary CPV system of the present disclosure includes an array of focusing elements 130, which can be a focusing lens or a focusing mirror. In one embodiment, the focusing elements 130 can be an array of Fresnel lenses 132.

The exemplary CPV system further includes an array of photovoltaic assembly 90, which is spaced from the focusing elements 130 approximately by the focal length of the focusing elements 130. The array of photovoltaic assembly 90 can be mounted, for example, on a base plate 110 or any other structure or surface suitable for permanent mounting. Each photovoltaic assembly 90 includes a photovoltaic cell 12 and a light pipe 10 (also referred to as "light prism") interposed between the photovoltaic cell 12 and the corresponding focusing element 130. The light pipe 10 is located in proximity to the front side of the photovoltaic cell 12. The light pipe 10 may, or may not, contact the front surface of the photovoltaic cell 12. The photovoltaic cell 12 can be a multijunction photovoltaic cell including a plurality of photovoltaic junctions at different depths such that the each photovoltaic junction efficiently converts the energy of the wavelength range of the solar radiation focused thereupon. The array of photovoltaic assembly 90 can be located on a plane that is parallel to the focusing elements. The array of photovoltaic assembly 90 can be arranged as a one-dimensional array or a two-dimensional array. Further, the array of photovoltaic assembly 90 can be arranged as a periodic array or in a non-periodic arrangement.

At least one support structure 120 may be optionally present between the focusing elements 130 and the base plate 110. The at least one support structure 120 can be a box frame or a set of columnar support structures or any other suitable mechanical structure configured to keep the focusing elements 130 in a fixed position relative to the array of the photovoltaic assembly 90.

CPV modules 140 are mounted on a tracker (not shown) which allows them to track the path of the sun throughout the days. The tracker is a mechanism that steadily changes the orientation of the modules so that their lens to cell direction, which is a direction approximately perpendicular to the plane of the lens 132, keeps pointing at the sun. The sun tracking motion is required to keep the focal spot of sun light aimed at the solar cell. This dynamic alignment of module direction onto the sun direction is key to proper operation of CPV.

The focusing elements 130 and each light pipe 10 are employed in conjunction to provide efficient light concentration. The focusing element 130 collects the light and focuses it onto a spot, which is usually equal or larger than, a photovoltaic cell 12. The size of the spot is preferably less than the front surface area of the corresponding light pipe 10, i.e., less than the area of the frontal surface of the light pipe 10 that is more proximal to the focusing element 130 than to the photovoltaic cell 12. The light pipe 10 guides the light impinging on the front surface to the photovoltaic cell 12 below. Typically, the light pipe 10 has a back surface area that does not exceed the area of the photovoltaic cell 12. The light pipe 10 can have a trapezoidal vertical cross-sectional area that has a longer side at the top (i.e., the upper side that is most proximal to the focusing element 130 and most distal from the photovoltaic cell 12) and a shorter side at the bottom (i.e., the lower side that is most distal from the focusing element 130 and most proximal to the photovoltaic cell 12). Alternatively, the sidewalls of the vertical cross-sectional area of the light pipe 10 can have a curvature.

Each light pipe 10 can be made out of a solid piece of optically transparent material having surfaces with smooth optical quality finish. Each light pipe 10 is a non-imaging optical element in the sense that each light pipe 10 does not focus light alone, but merely modifies the paths of light as defined primarily by the focusing elements 130. The primary objective of the light pipes is to capture a substantial amount of sun rays that would otherwise be lost, and to redirect them onto an area precisely matching the cell area, i.e., the active area of the underlying photovoltaic cell 12. The light redirection of the solar rays occurs via total internal reflection (TIR) on the trapezoidal sidewalls of the light pipe 10. Because the TIR process is very efficient, the power loss associated to these additional reflections is negligible.

If light pipes 10 were omitted, several factors contribute to loosing a substantial amount of light rays and thereby forfeiting photoelectric power. Alignment of focusing elements 132 and photovoltaic assemblies 90 is non perfect, both during assembly and during operation. During operation, sun tracking also reduces the accuracy of alignment, since tracking always entails errors associated to sensing the sun position, and to mechanical motion of the tracker. Weather conditions also contribute to diffusion or scattering of sun rays, and the light pipe allows collection and redirection of some of them unto the solar cell.

Each light pipe 10 also performs the function of homogenizing the optical intensities and spectra over the area of the photovoltaic cells 12. As used herein, light is "homogenized" by an element if the intensity distribution of light that passes through the element is more uniform than the intensity distribution of light before passing through the element. The uniformity of light can be measured by dividing the root mean square of the light intensity within a given area by the average of the light intensity within the same area.

Typically, the photovoltaic cells 12 are multijunction cells having different photovoltaic junctions optimized for absorbing photons in different wavelength ranges. The multiple photovoltaic junctions are located at different depths from the topmost surfaces of the photovoltaic cells 12. For most efficient power conversion, each area of the photovoltaic cell 12 should be illuminated by equal amounts of the solar rays in the multiple spectral regions. When using focusing elements 130 having different focal lengths for different wavelengths, the need to distribute solar rays evenly across the multiple spectral regions becomes a requirement for high performance since the multiple spectral regions are focused differently.

Each light pipe 10 of the present disclosure provides homogenization of the multiple spectral regions by diffraction and/or refraction of light. The use of diffraction and/or refraction for light homogenization provides the light pipes of the embodiments of the present disclosure distinct advantage. Specifically, the height of each light pipe 10 of the present disclosure can be much less than the height of prior art light pipes which is typically about 10 or more times the maximum lateral dimension of underlying photovoltaic cells. For example, the height of each light pipe 10 of the present disclosure can be about 2~8 times, and typically about 2.5~6 times, the maximum lateral dimension of underlying photovoltaic cells 12.

Alignment among components in CPV systems is affected by temperature cycling through exposure to sunlight and higher ambient temperature during day time and absence of sunlight exposure and lower ambient temperature during night time. Further, mechanical shocks and vibrations degrade the optical alignment of CPV systems over time. Thus, the high aspect ratio, i.e., the ratio between the height of a light pipe and the lateral dimension of the underlying photovoltaic cells, in prior art light pipes accelerate the degradation in the optical alignment of photovoltaic cells relative to focusing elements.

The reduced height of each light pipe 10 of the present disclosure reduces the thermal effects and vibrational effects on the alignment between the focusing elements 130 and the photovoltaic cells 12. Thus, the shortening of the height of each light pipe 10 improves the reliability of the CPV system of the present disclosure by better securing the light pipes 10 to the photovoltaic cells 12 and/or the base plate 110 and reducing misalignment and focal shift of the CPV system.

In addition, the each pipe 10 of the present disclosure can be lighter, and less bulky, than known prior art equivalents due to the reduced height. Thus, the manufacturing cost as well as the cost of assembly can be lower for each light pipe 10 of the present disclosure than for the longer light pipes known in the art.

Referring to FIGS. 3-11, the diffraction and/or refraction in the light pipe 10 of the embodiments of the present disclosure can be provided in various configurations depending on embodiments. Each exemplary photovoltaic assembly according to various embodiments of the present disclosure includes a light pipe 10 and a photovoltaic cell 12 located directly underneath the light pipe 10. The photovoltaic cell 12 may, or may not, contact the bottom surface 22 of the light pipe 10. In some cases, the bottom surface 22 of the light pipe 10 can be a flat surface contacting the top surface of the photovoltaic cell, via an optically transparent and index matched adhesive.

The light pipe 10 includes an optically transparent material portion, which is herein referred to as a first optically transparent material portion 20. A material is "optically transparent" if the material passes through at least a substantial fraction of the solar radiation wavelength range between 250 nm and 2,000 nm. The first optically transparent material portion 20 can be, but is not limited to, glass, sapphire (aluminum oxide), or a transparent plastic material. The light pipe 10 includes at least one pair of sidewalls 21 having a monotonically decreasing width therebetween with distance from the entrance surface to the exit surface. Each of the at least one pair of sidewalls 21 is a pair of opposing sidewalls of the first optically transparent material portion 20 located on opposite sides in a vertical cross-sectional view. In any of the embodiments below, the at least one pair of sidewalls 21 can have a strictly decreasing width therebetween with distance from the entrance surface to the exit surface.

In each pair of sidewalls 21 having a monotonically decreasing width therebetween with distance from the entrance surface to the exit surface, the pair of sidewalls adjoins a bottom surface of the light pipe 10 and has a vertical cross-sectional profile in which the lateral distance between the sidewalls 21 increases linearly or non-linearly with a vertical distance from the bottom surface. The light pipe 10 may includes multiple pairs of sidewalls 21 having a monotonically decreasing width therebetween with distance from the entrance surface to the exit surface. The surfaces of the sidewalls 21 can be planar, convex, and/or concave. In some embodiment, the surfaces of the sidewalls 21 can be parabolic.

In one embodiment, the sidewalls 21 of the light pipe 10 may, or may not, have an axial symmetry around a vertical axis through the center of the light pipe 10. In this embodiment, horizontal cross-sectional areas of a lower portion of the light pipe 10 are circle of which the total area depends on the location of the horizontal cross-sectional view. In another embodiment, the sidewalls of the light pipe 10 may have a multifold rotational symmetry around a vertical axis through the center of the light pipe. In this embodiment, horizontal cross-sectional areas of a lower portion of the light pipe 10 can be regular polygons such as a regular triangle, a rectangle, a regular pentagon, a regular hexagon, etc. In yet another embodiment, the horizontal cross-sectional areas of the light pipe 10 may be any closed shape, and the cross-sectional area of the light pipe 10 may increase strictly with distance from the bottom surface 22 of the light pipe 10. In general, the light pipe 10 is configured to include a pair of inverse-trapezoidal sidewalls 21 of the first optically transparent material portion 20, which may, or may not, be symmetric.

The aspect ratio of the light pipe 10 is defined as the ratio between the height and the lateral dimension of the light pipe at the top of the light pipe 10. If the light pipe 10 has at least two unequal lateral dimensions at the top, as in the case of a light pipe 10 having rectangular horizontal cross-sectional areas, the lateral dimension along a direction having the least average spacing is employed to determine the aspect ratio of the light pipe 10. Because light is diffracted or refracted near the top surface of the light pipe 10, the aspect ratio of the light pipe 10 of the present disclosure can be much less than the aspect ratio of prior art light pipes, and can be from 2 to 20, and typically from 2.5 to 5, although lesser and greater aspect ratios can also be employed.

The light pipe 10 is provided with at least one non-planar surface which is geometrically shaped to, i.e., configured to, diffract or refract light impinging thereupon. As a consequence of the diffraction or refraction of light at the at least one non-planar surface, intensity of light is homogenized at a bottom surface 22 of the light pipe 10.

Figure 3:
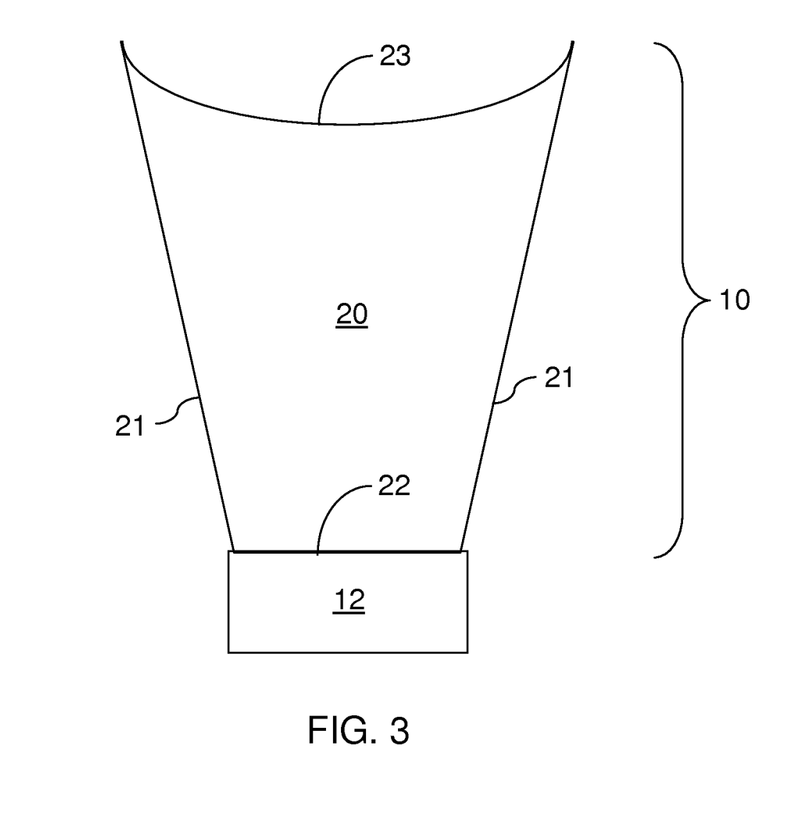
FIG. 3 is a vertical cross-sectional view of a first exemplary photovoltaic assembly.

Referring to FIG. 3, a first exemplary photovoltaic assembly according to a first embodiment of the present disclosure includes a light pipe 10 having a single contiguously concave non-planar surface 23, which is a topmost surface of the optically transparent material portion 20 and extends from the top of one of the pair of sidewalls 21 to the exit surface to the other of the pair of sidewalls 21. The pair of sidewalls has a monotonically decreasing width therebetween with distance from the entrance surface to the exit surface. The entrance surface is the topmost surface of the optically transparent material portion 20, and the exit surface is the bottommost surface of the light pipe 10, which is the bottommost surface of the optically transparent material portion 20. In the first embodiment, the single contiguously concave non-planar surface 23 is more proximate to the bottom surface 22 of the light pipe 10 at a center portion thereof than at a peripheral portion thereof. Light incident on the single contiguously concave non-planar surface 23 is defocused by refracting outward toward sidewalls 21 having a monotonically decreasing width therebetween with distance from the entrance surface to the exit surface of the optically transparent material portion 20.

Figure 4:
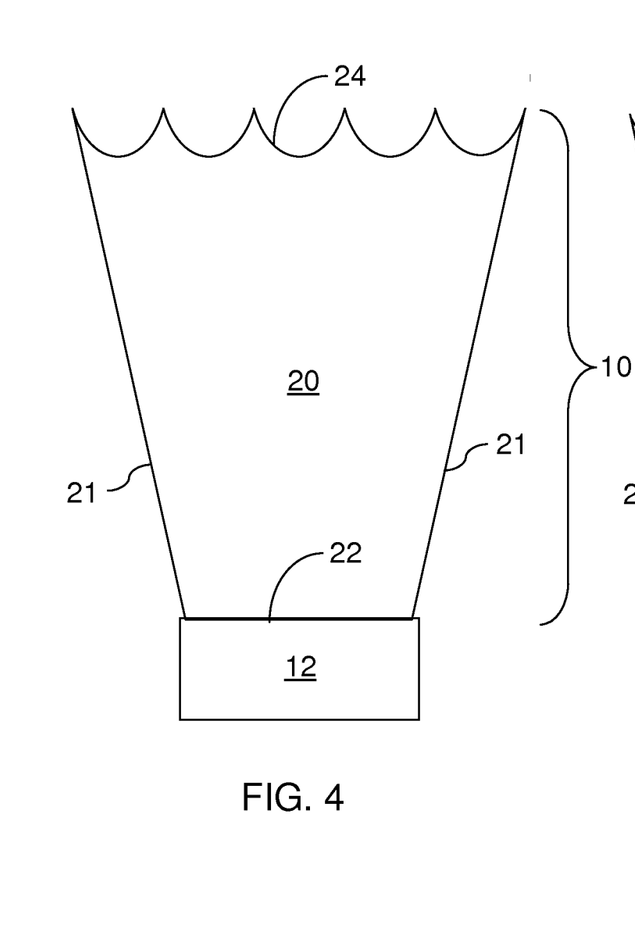
FIG. 4 is a vertical cross-sectional view of a second exemplary photovoltaic assembly.

Referring to FIG. 4, a second exemplary photovoltaic assembly according to a second embodiment of the present disclosure includes a light pipe 10 having a plurality of concave non-planar surfaces 24, i.e., multiple concave surfaces, which collectively constitute a topmost surface of the optically transparent material portion 20. This topmost surface of the optically transparent material portion 20 extends from the top of one of the pair of sidewalls 21 to the other of the pair of sidewalls 21. The pair of sidewalls 21 has a monotonically decreasing width therebetween with distance from the entrance surface to the exit surface. The entrance surface is the topmost surface of the optically transparent material portion 20, and the exit surface is the bottommost surface of the light pipe 10, which is the bottommost surface of the optically transparent material portion 20. In the second embodiment, the non-planar surface consists of the plurality of concave surfaces 24 that are adjoined to one another. The center portion of each concave surface within the plurality of concave surfaces 24 is more proximate to the bottom surface 22 of the light pipe 10 than a peripheral portion the same concave surface. Light incident on the plurality of concave surfaces 24 is defocused by refracting outward from each of the concave surfaces toward sidewalls 21 having a monotonically decreasing width therebetween with distance from the entrance surface to the exit surface of the optically transparent material portion 20.

Figure 5:
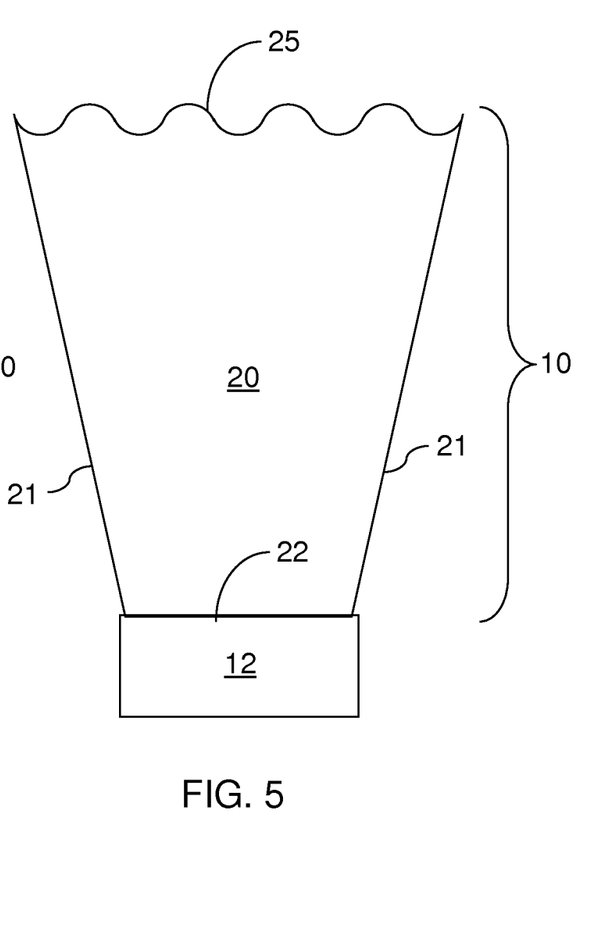
FIG. 5 is a vertical cross-sectional view of a third exemplary photovoltaic assembly.

Referring to FIG. 5, a third exemplary photovoltaic assembly according to a third embodiment of the present disclosure includes a light pipe 10 having a plurality of concave-convex non-planar surfaces 25, i.e., multiple concave surfaces and multiple convex surfaces that are adjoined to one another such a periphery of each of the multiple convex surfaces is adjoined to at least one periphery of one of the multiple concave surfaces. The multiple concave surfaces and multiple convex surfaces collectively constitute a topmost surface of the optically transparent material portion 20 and extend from the top of one of the pair of sidewalls 21 to the exit surface to the other of the pair of sidewalls 21. The pair of sidewalls 21 has a monotonically decreasing width therebetween with distance from the entrance surface to the exit surface. The entrance surface is the topmost surface of the optically transparent material portion 20, and the exit surface is the bottommost surface of the light pipe 10, which is the bottommost surface of the optically transparent material portion 20. Each convex surface can be adjoined to at least one concave surface, and each concave surface can be adjoined to at least one convex surface. A concave surface is in general more proximate to the bottom surface 22 of the light pipe 10 than convex surfaces surrounding and laterally adjoined to the concave surface. Light incident on a concave surface is defocused by refracting outward from the concave surfaces toward sidewalls 21 having a monotonically decreasing width therebetween with distance from the entrance surface to the exit surface of the optically transparent material portion 20. Light incident on a convex surface is becomes defocused despite the focusing nature of the convex surface because the focal length of the convex surface is typically less than one half of the height of the light pipe 10, and is typically at least one order of magnitude less than the height of the light pipe 10. The plurality of concave-convex non-planar surfaces 25 has a tendency of avoiding light scattering that is present at cusps between adjoining concave surfaces in the plurality of concave surfaces 24 according to the second embodiment.

Figure 6:
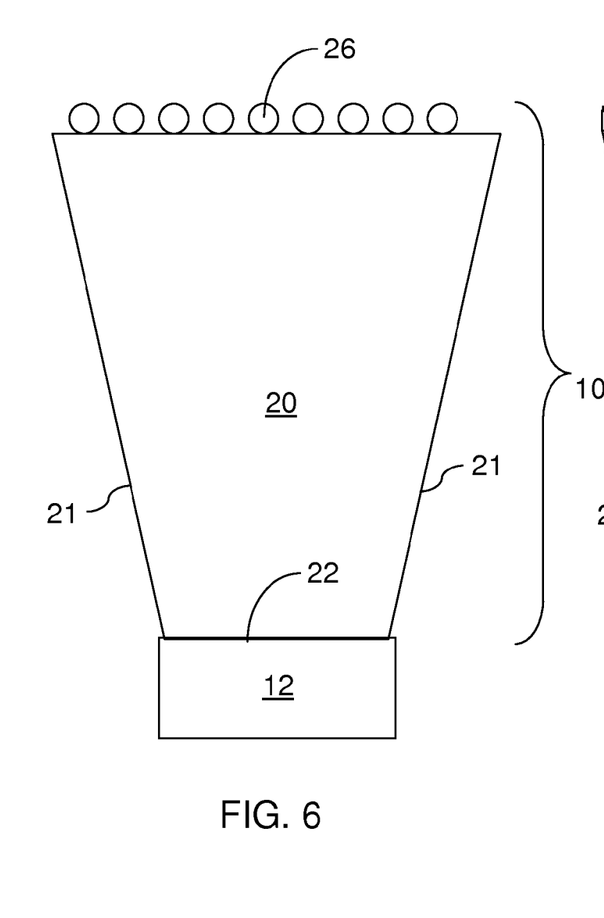
FIG. 6 is a vertical cross-sectional view of a fourth exemplary photovoltaic assembly.

Referring to FIGS. 6-11, another optically transparent material can be employed in addition to the optically transparent material of the optically transparent material portion 20. The other optically transparent material can contact a portion of the topmost surface of the optically transparent material portion 20 as illustrated in FIG. 6, or can contact the entirety of the topmost surface of the optically transparent material portion as illustrated in FIGS. 7-11. Depending on embodiments, the other optically transparent material can be the same or different from the optically transparent material of the optically transparent material portion 20.

Referring to FIG. 6, a fourth exemplary photovoltaic assembly according to a fourth embodiment of the present disclosure includes a light pipe 10, in which the other optically transparent material is placed as discrete elements on the topmost surface of the optically transparent material portion 20. In the fourth embodiment, the other optically transparent material contacts less than the entirety of the topmost surface of the optically transparent material portion 20. For example, the other optically transparent material can be disposed on top of the optically transparent material portion 20 as a plurality of optically transparent particles 26 having convex surfaces. The exposed surfaces of the plurality of optically transparent particles 26 collectively constitute at least one non-planar surface at which light is refracted. The plurality of optically transparent particles 26 may be spherical, ellipsoidal, or superellipsoidal, or may have any general shape that includes a contiguous portion of a convex surface, and may optionally include some concave surfaces. The lateral dimensions of the particles within the plurality of optically transparent particles 26 can range from 100 nm to 1,000 microns, although lesser and greater lateral dimensions can also be employed for the plurality of optically transparent particles 26. The material of the optically transparent material portion 20 and the material of the plurality of optically transparent particles 26 can be the same or different.

The topmost surface of the optically transparent material portion 20 may be a planar surface as illustrated in FIG. 6, or may be non-planar surfaces as illustrated in FIGS. 3-5. If the topmost surface of the optically transparent material portion 20 is planar, the refraction of light occurs only at the outer surfaces of the plurality of optically transparent particles 26. If the topmost surface of the optically transparent material portion 20 includes non-planar surfaces, the refraction of light occurs both at the outer surfaces of the plurality of optically transparent particles 26 and at the topmost surface of the optically transparent material portion 20. The plurality of optically transparent particles 26 can be attached to the top surface of the optically transparent material portion 20 by fusing or by an adhesive material. The plurality of optically transparent particles 26 can be present over the optically transparent material layer as a monolayer of optically transparent particles or as multiple layers of optically transparent particles.

Figure 7:
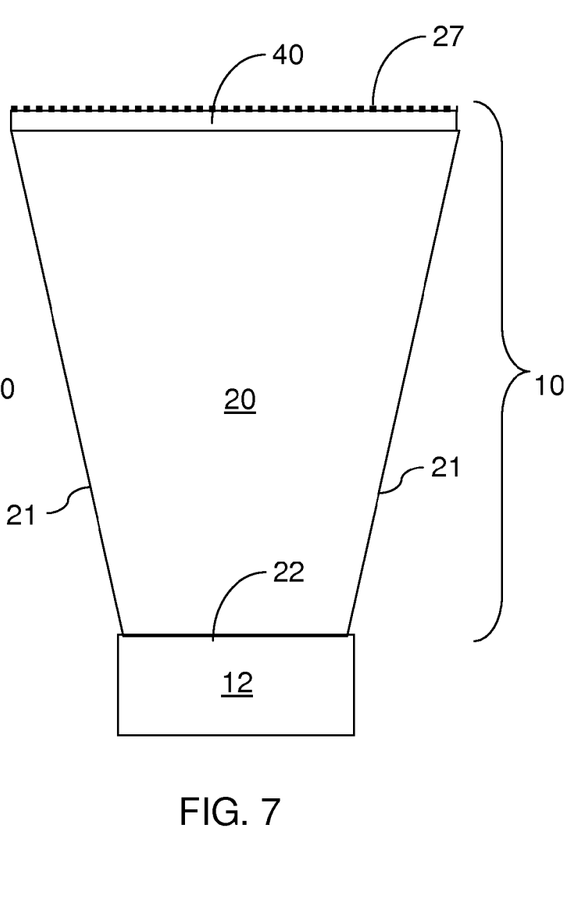
FIG. 7 is a vertical cross-sectional view of a fifth exemplary photovoltaic assembly.

Referring to FIG. 7, a fifth exemplary photovoltaic assembly according to a fifth embodiment of the present disclosure includes a light pipe 10, in which the other optically transparent material is placed as a contiguous optically transparent material layer 40 contacting the entirety of the topmost surface of the optically transparent material portion 20. The contiguous optically transparent material layer 40 includes at least one diffracting surface 27 on the front side and/or on the back side thereof. The diffracting surface 27 is a "holographic diffractive surface" or a surface of randomized depression.

As used herein, a "holographic diffractive surface" refers to any surface in which interference can occur between a plurality of coherent light beams from as single illumination source (such as the sun). Such a holographic diffractive surface can be provided by pattering a surface of the contiguous optically transparent material layer 40 with periodic patterns, which may include periodic depression or periodic protrusion in a one-dimensional or two-dimensional pattern. The periodicity of the one-dimensional pattern or the two-dimensional pattern can be from 100 nm to 10,000 nm, although lesser and greater periodicity can also be employed. The depth or height of the periodic depression or the periodic protrusion can be from 100 nm to 5,000 nm, although lesser and greater depths or heights can also be employed.

A surface of randomized depression can be formed by randomly etching one or both surfaces of the optically transparent material layer 40. The random etching of the surface(s) of the optically transparent material layer 40 can be effected, for example, by a chemical etch of which the etch rate is dependent on local concentration of impurities (such as boron or phosphorus or fluorine within silicate glass) or by mechanical means such as sand blasting. The surface(s) of the optically transparent material layer 40 may be polished after the chemical etch or sand blasting to provide a microscopically smooth (but including depressions) surface to minimize reflection from the surface. The surface(s) of the optically transparent material layer 40 may have randomized depressions with depths between 100 nm to 10 microns, although lesser and greater depths of depression can also be employed. The lateral dimensions of the randomized depression can range from 100 nm to 100 microns, although lesser and greater lateral dimensions can also be employed.

The holographic diffractive surface or randomly depressed surface of the optically transparent material layer 40 constitutes a non-planar surface at which light is diffracted. The material of the optically transparent material portion 20 and the material of the optically transparent material layer 40 can be the same or different.

The optically transparent material layer 40 can be disposed on a planar topmost surface of the optically transparent material portion 20 as illustrated in FIG. 7, or can be disposed on top of a non-planar surface of the optically transparent material portion 20 as illustrated in FIGS. 3-5. If the topmost surface of the optically transparent material portion 20 is planar, the light is diffracted at the surface(s) of the optically transparent material layer 40, but refraction of light is not directly involved in randomizing the direction of light. If the topmost surface of the optically transparent material portion 20 includes non-planar surfaces, the light is diffracted at the surface(s) of the optically transparent material layer 40 and is refracted at the topmost surface of the optically transparent material portion 20.

Figure 8:
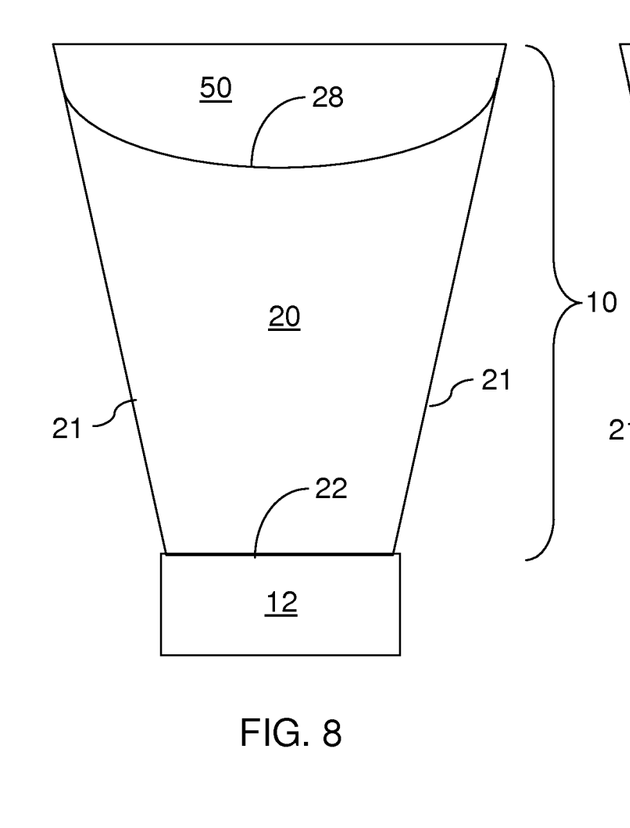
FIG. 8 is a vertical cross-sectional view of a sixth exemplary photovoltaic assembly.

Referring to FIG. 8, a sixth exemplary photovoltaic assembly according to a sixth embodiment of the present disclosure can be derived from the first exemplary photovoltaic assembly by modifying the light pipe 10 to include another optically transparent material that is different from the material of the optically transparent material portion 20. The other optically transparent material is shaped as a portion that fills a volume located directly above the topmost non-planar surface of the optically transparent material portion 20 of the light pipe 10 of the first embodiment. The portion that includes the other optically transparent material is herein referred to as the other optically transparent material portion 50.

In general, if the refractive index of the other optically transparent material portion 50 is less than the refractive index of the optically transparent material portion 20, the concave surface of the optically transparent material portion 20 remains as a concave surface. Thus, the interface 28 between the other optically transparent material portion 50 and the optically transparent material portion 20 can extend contiguously from one of the pair of sidewalls 21 to the other of the pair of sidewalls 21. The pair of sidewalls 21 has a monotonically decreasing width therebetween with distance from the entrance surface to the exit surface. The entrance surface is the topmost surface of the other optically transparent material portion 50, and the exit surface is the bottommost surface of the light pipe 10, which is the bottommost surface of the optically transparent material portion 20. In this case, the interface 28 is a non-planar surface at which light is refracted outward toward the sidewalls 21 having a monotonically decreasing width therebetween with distance from the entrance surface to the exit surface of the optically transparent material portion 20.

If the refractive index of the other optically transparent material portion 50 is greater than the refractive index of the optically transparent material portion 20, the curvature of the interface 28 can be changed from a concave surface for the optically transparent material portion 20 to a convex surface for the optically transparent material portion 20, which tends to refract light outward toward the sidewalls 21 having a monotonically decreasing width therebetween with distance from the entrance surface to the exit surface of the optically transparent material portion 20. In other words, the interface 28 between the other optically transparent material portion 50 and the optically transparent material portion 20 can be raised in the center and lowered at peripheries so that a lens formed by the other optically transparent material portion 50 defocuses light entering the optically transparent material portion 20.

Figure 9:
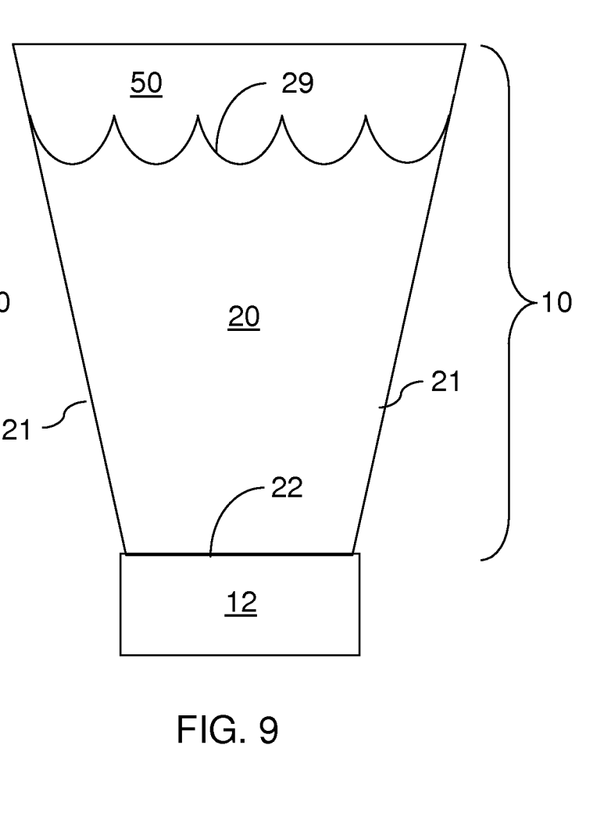
FIG. 9 is a vertical cross-sectional view of a seventh exemplary photovoltaic assembly.

Referring to FIG. 9, a seventh exemplary photovoltaic assembly according to a seventh embodiment of the present disclosure can be derived from the second exemplary photovoltaic assembly by modifying the light pipe 10 to include another optically transparent material that is different from the material of the optically transparent material portion 20. The other optically transparent material is shaped as a portion that fills a volume located directly above the topmost non-planar surface of the optically transparent material portion 20 of the light pipe 10 of the second embodiment. The portion that includes the other optically transparent material is herein referred to as the other optically transparent material portion 50.

Optionally, the multiple concave surfaces of the optically transparent material portion 20 of the second embodiment can be used without modification. Alternately, the curvature of the interface 29 may be optionally changed from concave surfaces for the optically transparent material portion 20 to convex surfaces for the optically transparent material portion 20. Thus, the interface 29 between the other optically transparent material portion 50 and the optically transparent material portion 20 can extend, as an adjoined set of concave surfaces of the optically transparent material portion 20, contiguously from one of the pair of sidewalls 21 to the other of the pair of sidewalls 21. The pair of sidewalls 21 has a monotonically decreasing width therebetween with distance from the entrance surface to the exit surface. The entrance surface is the topmost surface of the other optically transparent material portion 50, and the exit surface is the bottommost surface of the light pipe 10, which is the bottommost surface of the optically transparent material portion 20. In this case, the interface 29 is a non-planar surface at which light is refracted outward toward the sidewalls 21 having a monotonically decreasing width therebetween with distance from the entrance surface to the exit surface of the optically transparent material portion 20. Light passing through the interface 29 can be refracted outward irrespective of the direction of curvature of the non-planar interface 29 because the focal lengths of lenslets formed between the other optically transparent material portion 50 and the optically transparent material portion 20 at the interface 29 can be made to be less than one half of the shortest distance between the interface 29 and the bottom surface 22, and is typically less than the shortest distance between the interface 29 and the bottom surface 22 by a factor of two, thereby defocusing light that pass through the interface 29 by refraction.

Figure 10:
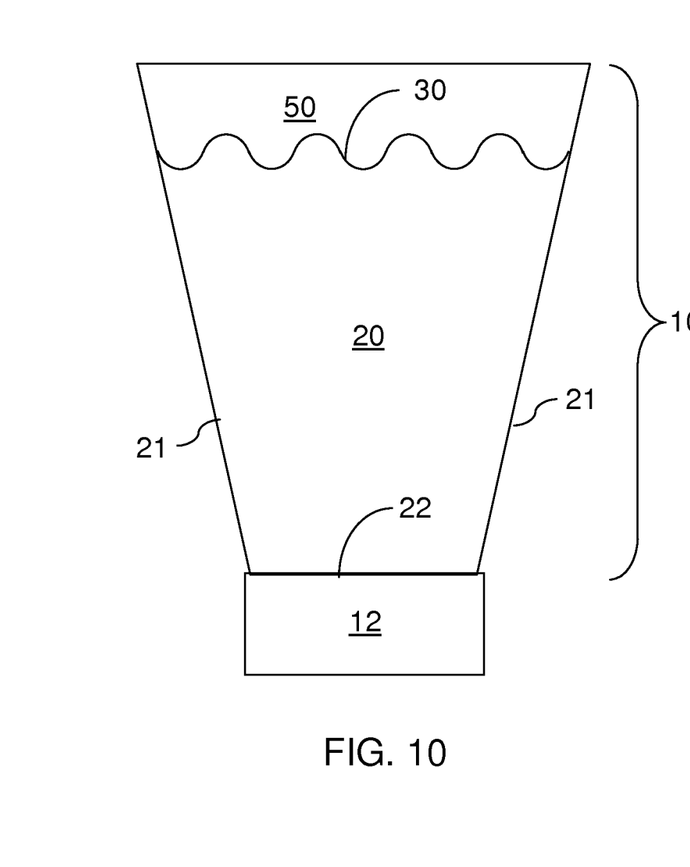
FIG. 10 is a vertical cross-sectional view of an eighth exemplary photovoltaic assembly.

Referring to FIG. 10, an eighth exemplary photovoltaic assembly according to an eighth embodiment of the present disclosure can be derived from the third exemplary photovoltaic assembly by modifying the light pipe 10 to include another optically transparent material that is different from the material of the optically transparent material portion 20. The other optically transparent material is shaped as a portion that fills a volume located directly above the topmost non-planar surface of the optically transparent material portion 20 of the light pipe 10 of the third embodiment. The portion that includes the other optically transparent material is herein referred to as the other optically transparent material portion 50. The interface 30 includes a non-planar surface that includes multiple convex surfaces and multiple concave surfaces of the optically transparent material portion 20, wherein a periphery of each of the multiple convex surfaces is adjoined to at least one periphery of the at least one concave surface.

In general, the multiple concave-convex surfaces of the optically transparent material portion 20 of the third embodiment can be employed. The interface 30 between the other optically transparent material portion 50 and the optically transparent material portion 20 can extend, as an adjoined set of concave surfaces and convex surfaces of the optically transparent material portion 20, contiguously from one of the pair of sidewalls 21 to the other of the pair of sidewalls 21. The pair of sidewalls 21 has a monotonically decreasing width therebetween with distance from the entrance surface to the exit surface. The entrance surface is the topmost surface of the other optically transparent material portion 50, and the exit surface is the bottommost surface of the light pipe 10, which is the bottommost surface of the optically transparent material portion 20. In this case, the interface 30 is a non-planar surface at which light is refracted outward toward the sidewalls 21 having a monotonically decreasing width therebetween with distance from the entrance surface to the exit surface of the optically transparent material portion 20. Light passing through the interface 30 can be refracted outward irrespective of the direction of curvature of the non-planar interface 30 because the focal lengths of lenslets formed between the other optically transparent material portion 50 and the optically transparent material portion 20 at the interface 30 are less than one half of the shortest distance between the interface 30 and the bottom surface 22, and is typically less than the shortest distance between the interface 30 and the bottom surface 22 by at least one order of magnitude, thereby defocusing light that pass through the interface by refraction.

Figure 11:
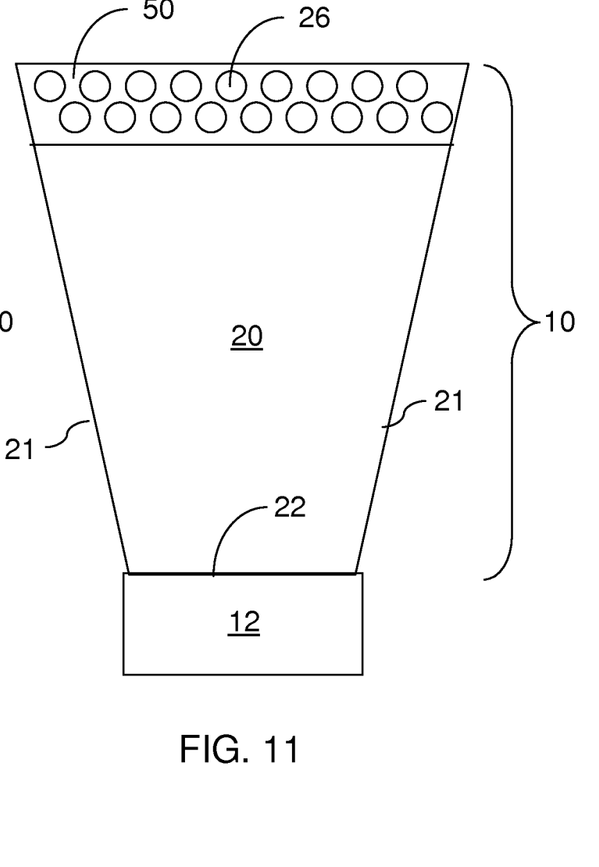
FIG. 11 is a vertical cross-sectional view of a ninth exemplary photovoltaic assembly.

Referring to FIG. 11, a ninth exemplary photovoltaic assembly according to a ninth embodiment of the present disclosure includes a plurality of optically transparent particles 26 that is embedded in an optically transparent material having a different index of refraction than the material of the plurality of optically transparent particles 26. The plurality of optically transparent particles 26 can be embedded in the optically transparent material portion 20 in the light pipe 10 illustrated in FIGS. 3-10, or can be embedded in the other optically transparent material portion 50 in the light pipe 10 illustrated in FIGS. 8-10, or can be embedded in other optically transparent material portion 50 contacting a planar top surface of the optically transparent material portion 20 having a different index of refraction than the other optically transparent material portion 50 as illustrated in FIG. 11. Alternately, the plurality of optically transparent particles 26 can be embedded in an upper portion of the optically transparent material portion 20 in a structure derived from the structure of FIG. 7 or the structure of FIG. 11 by removing all materials above the topmost surface of the optically transparent material portion 20. Yet alternately, a contiguous optically transparent material layer 40 including at least one diffracting surface 27 as illustrated in FIG. 7 can be inserted between the optically transparent material portion 20 and the other optically transparent material portion 50 as illustrated in FIG. 11. In FIG. 11, the material of the optically transparent particles 26 is referred to as a third optically transparent material, which can be the same as, or different from, the material of the optically transparent material portion 20, and has a different index of refraction from the material of the other optically transparent material portion 50.

The exposed surfaces of the plurality of optically transparent particles 26 function as lenslets that refract light. The plurality of optically transparent particles 26 may be spherical, ellipsoidal, or superellipsoidal, or may have any general shape that includes a contiguous portion of a convex surface, and may optionally include some concave surfaces. The lateral dimensions of the particles within the plurality of optically transparent particles 26 can range from 100 nm to 1,000 microns, although lesser and greater lateral dimensions can also be employed for the plurality of optically transparent particles 26. The material of the optically transparent material portion 20 and the material of the plurality of optically transparent particles 26 can be the same or different.

The plurality of optically transparent particles 26 can be embedded within the other optically transparent material portion 50 or an upper portion of the optically transparent material portion 20, for example, by timely injection during a molding process, i.e., while the optically transparent material is a fluid. In one embodiment, the melting temperature of the plurality of optically transparent particles 26 is greater than the melting temperature of the medium in which the plurality of optically transparent particles 26 is embedded in, i.e., either the other optically transparent material portion 50 or an upper portion of the optically transparent material portion 20. The plurality of optically transparent particles 26 can be present as a monolayer of optically transparent particles or as multiple layers of optically transparent particles. Alternately, the plurality of optically transparent particles 26 can be a fluid bubble including a liquid material or a gaseous material including, but not limited to, air or inert gases. In this case, gas can be injected into the other optically transparent material portion 50 during formation of the other optically transparent material portion 50, for example, by molding.

In the various embodiments illustrated in FIGS. 3-11, the at least one non-planar surface that provides refraction or diffraction is more proximal to a topmost surface of the light pipe 10 than to the bottom surface 22 of the light pipe to provide sufficient vertical distance through which the light arriving at the bottom surface 22 of the light pipe can be homogenized. In each of the exemplary photovoltaic assemblies of FIGS. 3-11, a photovoltaic cell 12 is located below the bottom surface 22 of the light pipe 10. The homogenization of light can be compared between the area of the bottom surface of the light pipe 22 and a hypothetical horizontal area that is located at a horizontal plane contacting the topmost point of a light pipe 10 and vertically commensurate with the topmost periphery of the sidewalls 21 having a monotonically decreasing width therebetween with distance from the entrance surface to the exit surface of the light pipe. As discussed above, the degree of homogenization of light can be measured by dividing the root mean square deviation of the intensity of light over the compared area by the average intensity of light in that area. Each light pipe 10 of the various embodiments of the present disclosure homogenizes light within the light pipe and provides a more uniform intensity distribution at the bottom surface 22 of the light pipe 10 than at the topmost hypothetical plane on which the light impinges.

As discussed above, the photovoltaic cell 12 can be a multijunction photovoltaic cell having a plurality of photovoltaic junctions located at different depths from a top surface of the photovoltaic cell 12. The various exemplary photovoltaic assemblies of the present disclosure can be employed in conjunction with a focusing element 130 (See FIGS. 1 and 2) configured to direct light toward the topmost surface of the light pipe 10 and configured to remain at a fixed position relative to the light pipe 10.

A plurality of light pipes 10 and a plurality of photovoltaic cells 12 can be employed in an array configuration. For example, a plurality of photovoltaic assemblies 90 of identical structure, each including a light pipe 10 and a photovoltaic cell 12, can be employed in an array configuration such as the configuration illustrated in FIG. 1.

In general, electrical power can be generated from a source of radiation more efficiently and/or with lesser cost and/or with less maintenance than by methods known in the art by providing a structure including at least one focusing element 130, at least one light pipe 10 of the present disclosure, and at least one photovoltaic cell 12, and by directing light from a light source (such as the sun) to the light pipe 10 by employing the focusing element 130. The photovoltaic cell 12 generates electrical power upon irradiation by light having homogenized intensity, which is provided by the light pipe 10 of the present disclosure.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A structure comprising at least a light pipe, said light pipe comprising a stack of a first optically transparent material portion comprising a first optically transparent solid material and a second optically transparent material portion comprising a second optically transparent solid material, said light pipe having an entrance surface at a top and an exit surface at a bottom that are respectively configured to provide for entry and exit of light rays, and having at least a pair of sidewalls having a monotonically decreasing width therebetween with distance from said entrance surface to said exit surface, and configured to provide internal reflection of said light rays within said light pipe, wherein a non-planar surface is provided within said light pipe at an interface between said first optically transparent material portion and said second optically transparent material portion, and said non-planar surface is geometrically shaped to diffract or refract light impinging thereupon, wherein intensity of light is homogenized at a bottom surface of said light pipe by diffraction or refraction of light at said non-planar surface, wherein said second optically transparent solid material has a greater thickness in a region in which a vertical distance between said non-planar surface and a horizontal plane including said exit surface is at a minimum than in a region in which said vertical distance is at a maximum.

2. The structure of claim 1, wherein said bottom surface is a planar surface.

3. The structure of claim 1, wherein said non-planar surface is a topmost surface of said first optically transparent material portion.

4. The structure of claim 1, wherein said non-planar surface includes at least one concave surface that is more proximate to said bottom surface at a center portion thereof than at a peripheral portion thereof.

5. The structure of claim 4, wherein said non-planar surface is a single concave surface that extends from one of said pair of sidewalls to another of said pair of sidewalls.

6. The structure of claim 4, wherein said non-planar surface includes multiple concave surfaces.

7. The structure of claim 6, wherein said non-planar surface consists of multiple concave surfaces that are adjoined to one another.

8. The structure of claim 6, wherein said non-planar surface further includes multiple convex surfaces, wherein a periphery of each of said multiple convex surfaces is adjoined to at least one periphery of one of said multiple concave surfaces.

9. The structure of claim 1, wherein said first optically transparent solid material and said second optically transparent solid material have different indices of refraction.

10. The structure of claim 9, wherein an interface between said second optically transparent solid material and said first optically transparent solid material extends contiguously from one of said pair of sidewalls to the other of said pair of sidewalls.

11. The structure of claim 1, wherein said non-planar surface includes at least one concave surface of said first optically transparent material portion, wherein each of said at least one concave surface is more proximate to said bottom surface at a center portion thereof than at a peripheral portion thereof.

12. The structure of claim 11, wherein said non-planar surface further includes multiple convex surfaces, wherein a periphery of each of said multiple convex surfaces is adjoined to at least one periphery of said at least one concave surface.

13. The structure of claim 1, wherein said non-planar surface is more proximal to a topmost surface of said light pipe than to said bottom surface.

14. The structure of claim 1, further comprising a photovoltaic cell located below said bottom surface.

15. The structure of claim 14, wherein said photovoltaic cell is a multijunction photovoltaic cell having a plurality of photovoltaic junctions located at different depths from a top surface of said photovoltaic cell.

16. The structure of claim 1, further comprising a focusing element configured to direct light toward said topmost surface and configured to remain at a fixed position relative to said light pipe.

17. The structure of claim 1, further comprising additional light pipes and a plurality of photovoltaic cells, wherein each of said additional light pipes has an identical shape as said light pipe, and said light pipe and said additional light pipes are arranged in an array, and each of said light pipe and said additional light pipes is located on one of said plurality of photovoltaic cells.

18. A method of generating electrical power from a source of radiation, said method comprising:
providing a structure comprising a focusing element, a light pipe, and a photovoltaic cell, said light pipe comprising a stack of a first optically transparent material portion comprising a first optically transparent solid material and a second optically transparent material portion comprising a second optically transparent solid material, and having at least a pair of sidewalls having a monotonically decreasing width therebetween with distance from an entrance surface to an exit surface, wherein a non-planar surface is provided within said light pipe at an interface between said first optically transparent material portion and said second optically transparent material portion, and said non-planar surface is geometrically shaped to diffract or refract light impinging thereupon, wherein said second optically transparent solid material has a greater thickness in a region in which a vertical distance between said non-planar surface and a horizontal plane including said exit surface is at a minimum than in a region in which said vertical distance is at a maximum; and directing light, by employing said focusing element, from a light source to said light pipe, wherein intensity of light at said non-planar surface is homogenized at a bottom surface of said light pipe by diffraction or refraction at said non-planar surface, and said photovoltaic cell generates electrical power upon irradiation by light having said homogenized intensity.

* * * * *